United States Patent
Suwa et al.

(10) Patent No.: US 7,622,734 B2
(45) Date of Patent: Nov. 24, 2009

(54) ORGANIC TRANSISTOR USING SELF-ASSEMBLED MONOLAYER

(75) Inventors: Yuji Suwa, Kokubunji (JP); Tomihiro Hashizume, Hatoyama (JP); Masahiko Ando, Cambridge (GB); Takeo Shiba, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 100 days.

(21) Appl. No.: 11/865,769

(22) Filed: Oct. 2, 2007

(65) Prior Publication Data
US 2008/0087883 A1 Apr. 17, 2008

(30) Foreign Application Priority Data
Oct. 3, 2006 (JP) ............................. 2006-271714

(51) Int. Cl.
*H01L 51/00* (2006.01)
(52) U.S. Cl. ............ 257/40; 257/E51.01; 257/E51.011; 257/E51.005; 438/82
(58) Field of Classification Search ............ 257/E51.01, 257/E51.011, E51.005, 40; 438/82
See application file for complete search history.

(56) References Cited
U.S. PATENT DOCUMENTS

| | | |
|---|---|---|
| 6,828,582 B1 | 12/2004 | Ando et al. |
| 7,102,155 B2 | 9/2006 | Ando et al. |
| 2004/0004215 A1 | 1/2004 | Iechi et al. |
| 2004/0012018 A1 | 1/2004 | Tanabe |
| 2004/0124410 A1 | 7/2004 | Lee et al. |
| 2005/0056897 A1 | 3/2005 | Kawasaki et al. |
| 2005/0140840 A1* | 6/2005 | Hirakata et al. ............... 349/43 |

(Continued)

FOREIGN PATENT DOCUMENTS

JP 2004-055654 2/2004

(Continued)

OTHER PUBLICATIONS

Structures and Stabilities of α-Hetero-Substituted Organolithium and Organosidium Compounds. Energetic Unimportant of Second-Row d-Orbital Effects. Schleyer et al. 1984. Journal of the American Chemical Society.*

(Continued)

*Primary Examiner*—A. Sefer
*Assistant Examiner*—Allen L Parker
(74) *Attorney, Agent, or Firm*—Antonelli, Terry, Stout & Kraus, LLP.

(57) ABSTRACT

Disclosed are a method for inexpensively reducing the contact resistance between an electrode and an organic semiconductor upon a p-type operation of the organic semiconductor; and a method for inexpensively operating, as an n-type semiconductor, an organic semiconductor that is likely to work as a p-type semiconductor. In addition, also disclosed are a p-cannel FET, an n-channel FET, and a C-TFT which can be fabricated inexpensively. Specifically, a p-type region and an n-type region is inexpensively prepared on one substrate by arranging an organic semiconductor that is likely to work as a p-type semiconductor in a p-channel FET region and an n-channel FET region of a C-TFT; and arranging a self-assembled monolayer between an electrode and the organic semiconductor in the n-channel FET region, which self-assembled monolayer is capable of allowing the organic semiconductor to work as an n-type semiconductor.

3 Claims, 2 Drawing Sheets

U.S. PATENT DOCUMENTS

2006/0237712 A1* 10/2006 Shukla et al. .................. 257/40

FOREIGN PATENT DOCUMENTS

| JP | 2004-128028 | 4/2004 |
|---|---|---|
| JP | 2004-211091 | 7/2004 |
| JP | 2005-093542 | 4/2005 |
| JP | 2005-109028 | 4/2005 |

OTHER PUBLICATIONS

Vikram C. Sundar, et al.; Elastomeric Transistor Stamps: Reversible Probing of Charge Transport in Organic Crystals; Science AAAS, www.sciencemag.org Mar. 12, 2004; pp. 1644-1646; vol. 303.

Oana D. Jurchescu, et al.; Effect of impurities on the mobility of single crystal pentacene; applied Physics Letters; Apr. 19, 2004; pp. 3061-3063; vol. 84, No. 16.

A. R. Brown, et al.; Precursor route pentacene metal-insulator-semiconductor filed-effect transistors; J. Appl. Phys. Feb. 15, 1996; pp. 2136-2138; vol. 79, No. 4.

Ali Afzali, et al.; High-Performance, Solution-Processed Organic Thin Film Transistors from a Novel Pentacene Precursor; J. Am. Chem. Soc. Jul. 9, 2002; pp. 8812-8813; vol. 124, No. 30.

Takashi Minakata, et al.; Direct Formation of Pentacene Thin Films by Solution Process; Synthetic Metals www.sciencedirect.com 2005; pp. 1-4.

Mika Nagano, et al.; The First Observation of $^1$H-NMR Spectrum of Pentacene; Japanese Journal of Applied Physics; Feb. 6, 2004; pp. L315-L316; vol. 43, No. 2B.

Takeshi Yasuda, et al.; Organic Semiconductors for Organic Transistors; Material Science, Faculty of Engineering Sciences, Kyushu University; pp. 1196-1201; In English pp. 1-7.

I. H. Campbell, et al.; Controlling Schottky energy barriers in organic electronic devices using self-assembled monolayers; Physical Review B; Nov. 15, 1996; pp. 14 321-14 324; vol. 54, No. 20.

* cited by examiner

US 7,622,734 B2

ORGANIC TRANSISTOR USING SELF-ASSEMBLED MONOLAYER

CLAIM OF PRIORITY

The present application claims priority from Japanese application No. 2006-271714, filed on Oct. 3, 2006, the entire content of which is herein incorporated by reference into this application.

BACKGROUND OF THE INVENTION (1) Field of the Invention

The present invention relates to an organic transistor prepared through a printing process; and a method for fabricating the same.

(2) Description of the Related Art

Thin-film transistors (TFTs) using amorphous silicon or polycrystalline silicon as channels have been used as elements for driving picture elements in thin display devices using organic electroluminescence elements or liquid crystals. These TFTs using amorphous silicon or polycrystalline silicon are difficult to have plasticity or flexibility, and they require vacuum facilities in their fabrication process, thus generally having high fabrication costs. Accordingly, a wide variety of investigations has been made to provide TFTs for use in driving circuits which are composed of organic materials in order to provide flexible display devices and to fabricate such devices at low costs.

Such organic thin-film transistors (organic TFTs) are expected to be fabricated at remarkably lower costs than TFTs using inorganic semiconductors, because organic semiconductor layers constituting channels can be formed according to a simple and convenient process such as a coating process, a printing process, a spraying process, or an ink-jet process in the organic TFTs. In addition, they are expected to be applied typically to liquid crystal displays, organic electroluminescence (organic EL) displays, and chip cards (IC cards), because large-screen, lightweight, thin displays and integrated circuits can be easily fabricated by using them.

To provide flexible display devices, other components including peripheral circuits for driving picture elements should also be flexible. TFTs for use in circuits for driving picture elements should have a carrier mobility of about 10 $cm^2/V.s$. It has been demonstrated that TFTs using low-molecular-weight organic molecules as channels satisfy this condition. For example, an organic TFT using a single crystal of rubrene molecule disclosed in Science, 303, 1644(2004) has a carrier mobility of 15 $cm^2/V.s$. A single crystal of highly purified pentacene reported in Applied Physics Letters, 84, 3061(2004) has a carrier mobility of 35 $cm^2/V.s$ at room temperature.

However, although easily having improved performance, organic TFTs composed of low-molecular-weight molecules are disadvantageous in fabrication, because TFTs of this type are generally fabricated through vacuum vapor deposition. In contrast, TFTs composed of polymeric molecules can be fabricated at lower costs but they have remarkably low performance and are limited in their applications.

As a possible solution to these problems, there has been proposed a technique of forming a semiconductor layer of a channel by dissolving a low-molecular-weight compound in a solvent to form a solution and applying the solution. Pentacene is a most representative organic compound to be applied as a low-molecular-weight compound to a TFT, and pentacene will be taken as an example hereinbelow. For example, there is a technique of synthetically preparing a pentacene derivative having an increased solubility in a solvent, dissolving the pentacene derivative in the solvent to form a solution, and applying the solution to form a thin film. This technique is reported in Journal of Applied Physics, 79, 2136(1996) and Journal of American Chemical Society, 124, 8812(2002). A technique for forming a thin film of pentacene is described in Synthetic Metals, 153, 1(2005). According to this technique, pentacene is directly dissolved in a solvent to form a solution, and the solution is applied to form a thin film of pentacene. In addition, procedural steps for dissolving pentacene molecule in an organic solvent are described in Applied Physics Letters, 84, 3061 (2004) and Japanese Journal of Applied Physics, 43, 2B, L315 (2004).

It is also desirable to form not only organic semiconductors but also electrodes and interconnections composed of metallic wires by application (printing), for fabricating organic FETs by printing at low costs. As a possible solution to this, there is a technique for forming metallic interconnections and electrodes by preparing fine particles of a metal, covering the fine particles typically with an organic material so as to increase solubility of the fine particles in a solvent, dissolving the coated fine particles in the solvent to form a metallic ink or paste, applying the metallic ink or paste through printing to predetermined portions, removing the organic material through a treatment at a predetermined temperature to thereby form metallic interconnections and electrodes. There has been established a technique for forming interconnections by applying a paste containing fine silver particles or fine gold particles through printing.

On the other hand, complementary metal oxide semiconductor (CMOS) transistors should be employed for the integration of FETs using silicon. These CMOS transistors include two types of FETs, i.e., an n-channel MOS using electron as a carrier for conducting in channel, and a p-channel MOS using hole as a carrier for conducing in channel, in which the n-channel MOS and the p-channel MOS are arranged in series. The CMOS transistors consume less power. However, most of known organic TFTs work only as p-type FETs. Several possible causes thereof have been proposed, but they are still argued. For example, n-channel and p-channel organic FETs are disclosed by way of example in Oyo Butsuri (in Japanese; "Applied Physics"), 74, 9, 1196 (2005). This document discloses an n-type TFT and a p-type TFT composed of different organic semiconductors, but fails to refer to an economically advantageous process, and fails to indicate the principle and inspection to constitute an n-type TFT and a p-type TFT respectively.

Japanese Patent Application Laid-Open Publication No. 2004-55654 discloses an organic semiconductor device including source/drain electrodes composed of materials having different work functions. Patent Document 1 describes that a material for the source electrode for use in a p-type organic semiconductor device is preferably one having a large work function; and that a material for the drain electrode is preferably one having a work function smaller than that of the source electrode. Examples of a material having a larger work function include metals such as gold, platinum, palladium, chromium, selenium, and nickel; indium tin oxide (so-called ITO), iridium zinc oxide (so-called IZO), zinc oxide, alloys of these metals, tin oxide, and copper iodide. Examples of a material having a smaller work function include metals such as silver, lead, tin, aluminum, and indium; alkali metals such as lithium; alkaline earth metals such as calcium and magnesium; alloys of these metals; compounds of alkali metals; and compounds of alkaline earth metals.

However, the type of an electrode, i.e., an n-type or p-type is not determined merely by the work function of the electrode, because exchange of a charge and/or screening of a charge generally occurs at the interface between an electrode and an organic semiconductor when the electrode and the organic semiconductor come in contact with each other.

Japanese Patent Application Laid-Open Publication No. 2004-211091 discloses an organic semiconductive polymer for an organic thin-film transistor. This organic semiconductive polymer exhibits both a p-type electric property and an n-type electric property by introducing a unit having a p-type semiconductive property, such as thiophene unit, and a unit having an n-type semiconductive property, such as thiazole unit (thiazole ring) into a principal chain of the polymer. Japanese Patent Application Laid-Open Publication No. 2004-211091 mentions that an organic thin film transistor having a low off-state current and exhibiting both a p-type electric property and an n-type electric property may be provided by using the organic semiconductive polymer. However, the specification (definition) of properties as a bulk does not determine the properties of an organic thin film transistor, because the electron structures of semiconductor at an interface between an electrode and the organic semiconductor and at an interface between an insulator and the organic semiconductor are not determined.

Japanese Patent Application Laid-Open Publication No. 2004-128028 discloses an organic FET using a metal oxide as a semiconductor layer. Examples of the metal oxide include metal oxides which show a high electroconductivity upon shifting from a stoichiometric ratio so as to form an oxygen vacancy or interstitial metal, such as tin oxide, titanium oxide, germanium oxide, copper oxide, silver oxide, indium oxide, thallium oxide, barium titanate, strontium titanate, lanthanum chromate, tungsten oxide, europium oxide, aluminum oxide, and lead chromate; metal oxides which show a highest electroconductivity at a stoichiometric ratio, such as rhenium oxide, titanium oxide, lanthanum titanate, lanthanum nickelate, lanthanum copper oxide, ruthenium copper oxide, strontium iridate, strontium chromate, lithium titanate, iridium oxide, and molybdenum oxide; electroconductive metal oxides such as vanadium oxide, chromium oxide, calcium iron oxide, strontium iron oxide, strontium cobaltate, strontium vanadate, strontium ruthenate, lanthanum cobaltate, and nickel oxide; electroconductive metal oxide bronzes, such as a tungsten bronze, a molybdenum bronze, and a rhenium bronze ($M_xWO_3$, $M_xMoO_3$, and $M_xReO_3$) corresponding to tungsten oxide, molybdenum oxide, and rhenium oxide, respectively, except for containing hydrogen atom, an alkali metal, an alkaline earth metal, or a rare earth metal in a portion at Position A of perovskite structure of the oxide where no atom is present. These metal oxides, however, are used not as electrodes but only as semiconductor materials in this technique.

In addition to these attempts for improvements in semiconductor materials and electrode materials, Physical Review B, 54, 14321 (1996) proposes a technique for reducing a Schottky barrier between an electrode and a semiconductor. According to this technique, an organic self-assembled monolayer is arranged between a regular electrode and an organic semiconductor material; and a potential difference is allowed to occur at the interface therebetween using original electric dipole moments of molecules constituting the materials, so as to reduce the Schottky barrier between the electrode and the semiconductor.

FIGS. 1A, 1B, and 1C illustrate an occupied level 51 of a conduction electron of a metal; an unoccupied level 52 of a conduction electron of the metal; a Fermi level 53 of the metal; a valence band 61 of a semiconductor; and a conduction band 62 of the semiconductor. With reference to FIG. 1A, when a semiconductor and a metal as an electrode are in contact with each other, the Fermi level 53 of the metal electrode (the left view in FIG. 1A) generally stands between the valence band 61 and the conduction band 62 of the semiconductor (the right view in FIG. 1A) in contact with the metal electrode, namely, it stands within the band gap. The larger the difference in levels between the Fermi level 53 and the upper end of the valence band 61 of the semiconductor (in the case of a p-type semiconductor) or the difference between the Fermi level 53 and the lower end of the conduction band 62 of the semiconductor (in the case of an n-type semiconductor) is, the larger the Schottky barrier is and the larger the contact resistance is.

In contrast, when a self-assembled monolayer is formed between a metal and a semiconductor so as to be in contact with the metal and the semiconductor respectively, the self-assembled monolayer effectively acts to yield a potential difference. Thus, a semiconductor, if working as a p-type semiconductor, can work more satisfactorily as a p-type semiconductor, because the electron level of the semiconductor is raised so as to reduce the difference in energy between the Fermi level 53 and the upper end of the valence band 61 of the semiconductor and to facilitate the injection of a hole from the electrode to the semiconductor (FIG. 1B). Alternatively, a semiconductor, if working as an n-type semiconductor, can work more satisfactorily as an n-type semiconductor, because the electron level of the semiconductor is lowered so as to reduce the difference in energy between the Fermi level 53 and the lower end of the conduction band 62 of the semiconductor and to facilitate the injection of an electron from the electrode to the semiconductor (FIG. 1C). The Schottky barrier can be lowered and the contact resistance can be reduced by bringing the electron level of the semiconductor near to the Fermi level of the metal in the above-mentioned manner.

The technique disclosed in Physical Review B, 54, 14321 (1996) carries out a calculation of electronic state of a single molecule and thereby proposes a molecular material which has such an electric dipole moment as to facilitate the injection of a hole from an electrode to a semiconductor efficiently, namely as to reduce the Schottky barrier to a p-type semiconductor. The estimation (calculation) according to this technique, however, may not accurately predict how large potential difference occurs on a surface of an actual electrode, because the estimation does not employ, for example, an effect of charge transfer from an electrode to a molecule when the molecule is actually adsorbed to a surface of a metal constituting the electrode.

In known inorganic FETs using silicon as a base, the type and concentration of a dopant in silicon are spatially controlled through ion implantation. Thus, the contact resistance with an electrode is reduced; the threshold of a gate voltage is controlled; a leakage current is prevented; and the mobility of a channel region is ensured. Doping through ion implantation, however, may not be adopted to organic FETs, because a doping technique to organic semiconductors through ion implantation has not yet been established. In addition, such ion implantation doping technique is remarkably expensive and is not suitable for organic FETs which have value in their low costs. Accordingly, the control technique of semiconductor materials effective for inorganic FETs is not effective and is unsuitable and inapplicable for organic FETs.

SUMMARY OF THE INVENTION

Accordingly, it is desirable to provide a method for inexpensively reducing a contact resistance between an electrode and an organic semiconductor, which contact resistance occurs when the organic semiconductor is operated as a p-type semiconductor; and a method for inexpensively operating, as an n-type semiconductor, an organic semiconductor that is likely to work as a p-type semiconductor. In addition, it is also desirable to provide a p-cannel FET, an n-channel FET, and a complementary thin film transistor (C-TFT) which can be fabricated inexpensively. We call transistors having the same function as CMOS transistor C-TFT, independent of existence of oxides.

According to an embodiment of the present invention, a self-assembled monolayer (SAM) is formed between an electrode and an organic semiconductor. The self-assembled monolayer herein yields a sufficiently large potential difference between the two sides of the monolayer when it is adsorbed to a surface of the electrode. By the action of the potential difference, the electron level of the organic semiconductor is raised or lowered so as to control the electroconductivity as a p-type or an n-type semiconductor. Such an organic FET using an organic semiconductor is advantageous in that it can be fabricated inexpensively, because the entire of the organic FET including the organic semiconductor and electrodes can be prepared by low-temperature printing processes. The process of forming a self-assembled monolayer may not remarkably raise the fabrication cost, because it can include similar steps as in a printing process of forming another structure, such as the steps of dissolving a material molecule in a solvent to form a solution, applying the solution to a surface of a metal, drying the applied film, and removing the solvent. Accordingly, the use of a self-assembled monolayer is suitable for an organic FET.

According to embodiments of the present invention, there can be manufactured an organic FET having improved performance at low cost; there can be manufactured a complementary thin film transistor (C-TFT) using organic TFTs and consuming less power. In addition, there can be easily manufactured a large-area, lightweight, thin integrated circuit using organic TFTs. Such organic TFTs and organic thin-film devices can be adopted to, for example, liquid crystal displays, organic electroluminescence displays, chip cards (IC cards), and tags.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Embodiment 1

Figure 1A:
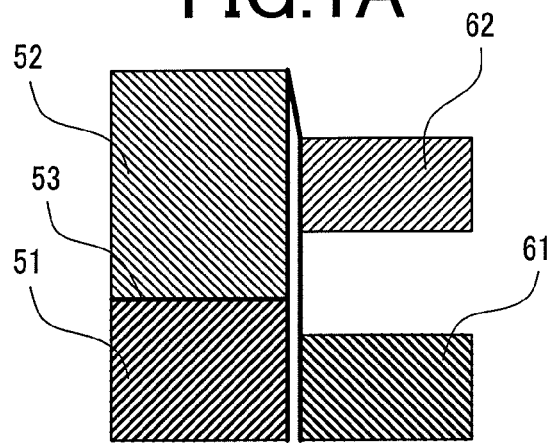
FIGS. 1A, 1B, and 1C are schematic diagrams each showing electron levels of a metal and a semiconductor.
Figure 1B:
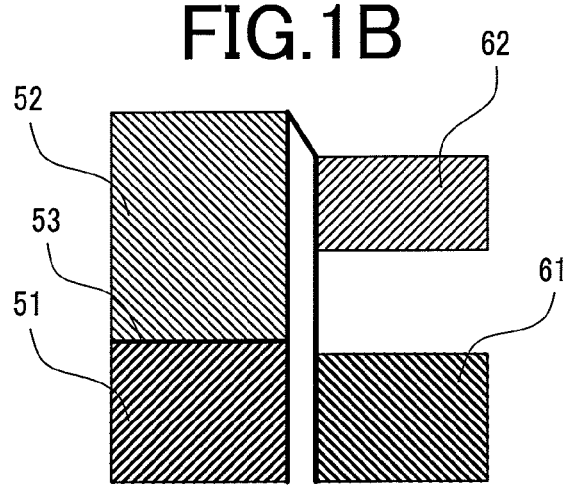
Figure 1C:
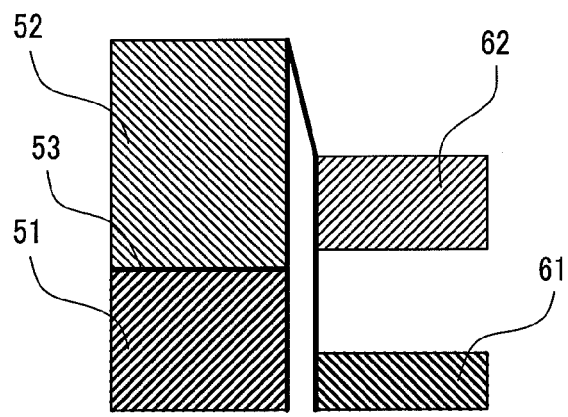

Embodiment 1 relates to the selection of a material for self-assembled monolayer which facilitates injection of a hole from an electrode to an organic semiconductor that is likely to work as a p-type semiconductor, typified by pentacene. It also relates to a method for forming a junction structure between an electrode and an organic semiconductor using the selected self-assembled monolayer.

Most of organic semiconductors typified by pentacene have band gaps larger than that of silicon, in which the upper end of the valence band 61 is nearer to the Fermi level 53 of a metal constituting the electrode, such as gold, silver, or copper, than the lower end of the conduction band 62 is. Accordingly, most of such organic semiconductors are more likely to work as p-type semiconductors than to work as n-type semiconductors. Even when they are operated as p-type semiconductors, however, they invite increased contact resistance, because the upper end of the valence band of such organic semiconductors are not sufficiently near to the Fermi level of a metal, and the difference between these levels causes a large Schottky barrier and an increased contact resistance. When a self-assembled monolayer is formed between the metal electrode and the organic semiconductor, it should be so controlled that a potential difference occurs at interfaces by the action of the self-assembled monolayer, and the potential at an interface with the organic semiconductor is higher than that at another interface with the electrode. Thus, the difference in level between a metal electrode and an organic semiconductor can be lowered, and the Schottky barrier can thereby be reduced.

A self-assembled monolayer may be prepared by allowing a molecular material to be adsorbed to a surface of a metal, which molecular material has such a structure that a part of the molecule is likely to be adsorbed to a surface of a metal. To form a self-assembled monolayer between an electrode and an organic semiconductor during processes for forming an entire FET structure by printing (application), it is effective to apply a solution containing a molecular material to an electrode after its formation, drying an applied layer to evaporate the solvent, and carrying out a subsequent process of forming an organic semiconductor by printing. The magnitude of the resulting potential difference varies depending on a selected molecular material.

The molecular material in this case should be such a molecule that, when the molecule is adsorbed to a surface of a metal electrode, a positive charge is likely to accumulate at the bottom of the molecule at which the molecule is adsorbed to the metal electrode, and a negative charge is likely to accumulate at the end of the molecule opposite to the metal electrode. A potential difference occurring at interfaces is almost proportional to the number of molecules adsorbed to the metal electrode, namely, it is proportional to the areal density of molecules in the self-assembled monolayer. This is because the potential difference is caused by an electric field due to the polarization of the charge distribution of the adsorbed molecules. The areal density can be increased by increasing the concentration of the molecule in a coating solution (coating composition), by increasing the amount of the coating solution to be applied, and/or by increasing the time period before drying; and vice versa.

Accordingly, when a molecule causing a largest electric field is used, the potential difference can be controlled to a largest potential difference or less by adjusting the areal density of the molecule according to the above-mentioned adjusting process. The largest potential difference herein is defined as a potential difference when the molecule is adsorbed at a highest density.

The technique disclosed in Physical Review B, 54, 14321 (1996) calculates the electric dipole moment of a single molecule alone and considers the possibility of adaptation of such calculation. This calculation, however, does not bear in mind effects of an electrode being in contact with the molecule and thereby fails to provide sufficient findings about the selection of a specific molecular material.

The present inventors carried out first-principle calculations with geometry optimization including an electrode structure to determine an electronic state and an entire electric dipole moment. As a result, they found that a molecular material that can yield an electric field in the desired direction and provide a largest potential difference is an alkylthiol with fluorines replacing all the hydrogens (perfluoroalkylthiol), represented by SH—$(CF_2)_n$F, wherein "n" denotes an integer of 1 or more. The hydrogen bonded to the sulfur atom leaves when the molecule is adsorbed to a surface of the electrode, and thereby the sulfur atom is chemically bonded to a metal atom at a surface of the electrode.

The suitability of this molecule cannot be found by the electric dipole moment of the molecule by itself. Although fluorine atom is likely to accumulate a negative charge more than other atoms, the subject molecule does not cause a large electric dipole moment, because the molecule itself is likely to be negatively charged but is free from polarization of charge distribution in the molecule. A large electric dipole moment in an entire region including the molecule and the surface of the electrode occurs only after the molecule is adsorbed to the electrode and a charge transfers from the electrode.

Specifically, when trifluoroethanethiol as the molecule is adsorbed to the (111) plane of a surface of gold at a density of one molecule per four gold atoms at an outermost surface (a density near to the largest density, about $3.3 \times 10^{18}$ per square centimeter), one molecule of trifluoroethanethiol causes an electric dipole moment of about 0.5 eÅ (angstrom) in a direction from the self-assembled monolayer toward the electrode. In this connection, a surface of gold in the vicinity of the trifluoroethanethiol molecule also contributes to this electric dipole moment. The potential difference caused by the entire self-assembled monolayer at this density is about 1 V. The difference in energy between the Fermi level of gold and the upper end of the valence band of pentacene is about 0.5 eV. Accordingly, when the areal density of the molecule is set to about a half that in this example, the resulting potential difference becomes about 0.5 V, and the two levels are substantially equal to each other. Thus, the Schottky barrier can be significantly lowered.

Fluorine, if used as an element for replacing hydrogen of an alkylthiol, yields a largest potential difference. However, a potential difference in a desired direction can be obtained to some extent when another halogen atom, such as chlorine, bromine, or iodine, is used instead of fluorine. When the target potential difference is not so large, an alkylthiol replaced or substituted with another halogen atom than fluorine atom can also be used instead of a perfluoroalkylthiol.

The calculations show that the resulting potential difference gradually but not so much increases with an increasing length of a perfluoroalkylthiol (with an increasing number "n"). On the other hand, the self-assembled monolayer is preferably as thin as possible, because if the self-assembled monolayer has an excessively large thickness, the distance (length) of a tunnel which an electron or a hole goes through increases to thereby increase the resistance. Accordingly, of perfluoroalkylthiols, most ideal materials for self-assembled monolayer include trifluoromethanethiol wherein "n" is 1 and pentafluoroethanethiol wherein "n" is 2. However, other perfluoroalkylthiols such as heptafluoropropanethiol wherein "n" is 3, nonafluorobutanethiol wherein "n" is 4, and undecafluoropentanethiol wherein "n" is 5 are also possible candidates, because self-assembled monolayers can be easily prepared from these materials. In addition, when there is no necessity of increasing the areal density so much, a self-assembled monolayer can be prepared by using a long molecule, because the molecule in this case is present as lying at an interface. In this case, a perfluoroalkylthiol wherein "n" is about 30 or less is also usable.

Figure 2:
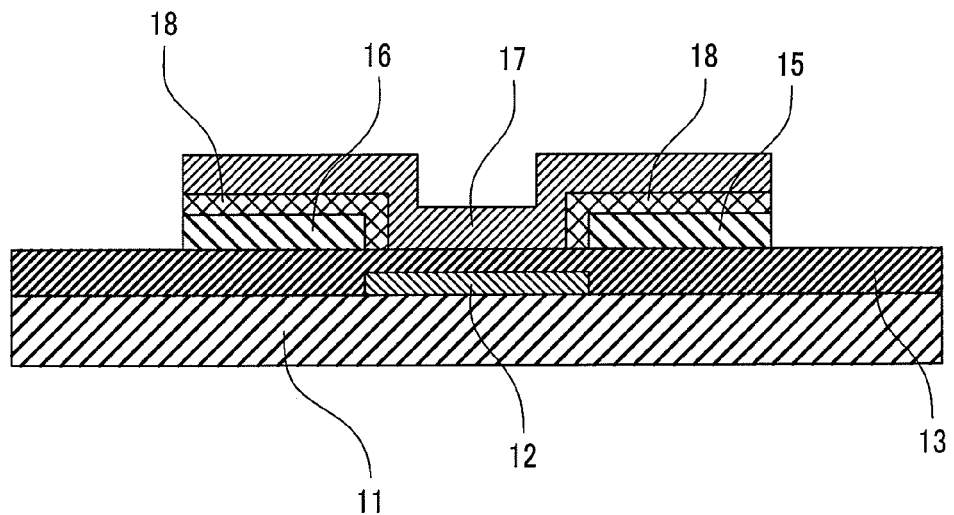
FIG. 2 is a cross sectional view showing a structure of a p-channel organic FET according to an embodiment of the present invention.

FIG. 2 is a cross sectional view schematically showing a structure of a p-channel organic FET according to an embodiment of the present invention. In FIG. 2, an organic thin-film semiconductor 17 is a polycrystalline pentacene thin film composed of pentacene crystal grains. The p-channel organic FET herein is composed of a source electrode 15, a drain electrode 16, an organic thin-film semiconductor 17, and a gate electrode 12.

The p-channel organic FET may be prepared in the following manner. Initially, a gate electrode 12 is formed on a top surface of a substrate 11 by printing (application), and an insulating layer 13 is formed thereon by printing. Next, a source electrode 15 and a drain electrode 16 are formed thereon by printing. In this process, the registration of these components should be done so as to provide a relative positional relation with respect to the formed gate electrode 12 underlying the insulating layer 13 as in FIG. 2.

Next, a self-assembled monolayer 18 is formed on the source electrode 15 and the drain electrode 16 by dissolving a molecular material in a solvent to form a printing solution, and applying the printing solution. In this process, it is desirable to form the self-assembled monolayer 18 only on the electrodes. However, the self-assembled monolayer 18 may be formed on the entire surface by applying the printing solution to the entire surface when the registration requires much cost. Next, a p-channel organic FET is completed by forming an organic thin-film semiconductor 17 through printing to a predetermined region. Ultimately, a coating layer is formed so as to cover the entire surface of the p-channel organic FET so as to prevent it from deterioration or denaturation.

The p-channel organic FET is so illustrated in FIG. 2 that the self-assembled monolayer 18 is arranged to cover the entire top surfaces of the source electrode 15 and the drain electrode 16; and the organic thin-film semiconductor 17 is arranged to cover the entire top surface of the self-assembled monolayer 18. However, it is not necessary to arrange the self-assembled monolayer 18 and the organic thin-film semiconductor 17 so as to cover the entire top surfaces of the source electrode 15 and the drain electrode 16, because the exchange of an electron of the source electrode 15 and the drain electrode 16 with the organic thin-film semiconductor 17 is probably largely owing to a region of a channel.

Embodiment 2

Embodiment 2 relates to the selection of a material for self-assembled monolayer which enables an organic semiconductor to work as an n-type semiconductor by facilitating injection of an electron from an electrode to the organic semiconductor. The organic semiconductor employed herein is likely to work as a p-type semiconductor as a result of hole injection, typified by pentacene.

Most of organic semiconductors, such as pentacene, are more likely to work as p-type semiconductors than to work as n-type semiconductors, as described in Embodiment 1. This is because the energy difference between the Fermi level of a metal and the lower end of the conduction band of an organic semiconductor is larger than that between the Fermi level of the metal and the upper end of the valence band of the organic semiconductor. If a self-assembled monolayer causing a sufficiently large potential difference in a reverse direction to that in Embodiment 1 is available, the electron injection into an organic semiconductor can be facilitated, and the organic semiconductor can work as an n-type semiconductor. Constituting not only a p-type FET but also an n-type FET is necessary for the fabrication of an organic complementary thin film transistor (organic C-TFT).

Desired herein is a self-assembled monolayer acting to yield a potential difference in a reversed direction to that in Embodiment 1, namely, to yield a potential difference at an interface with the organic semiconductor higher than that at an interface with the electrode. A usable molecular material to form this self-assembled monolayer is such a molecule that a negative charge is likely to accumulate at the bottom of the molecule which is adsorbed to the electrode, and a positive charge is likely to accumulate at the end of the molecule opposite to the bottom. Calculations on a structure where a molecule is adsorbed to an electrode show that an alkylthiol represented by SH—$(CH_2)_n$H, wherein "n" is an integer of 1 or more, can cause a significantly large electric dipole moment in the desired direction. Here, the hydrogen bonded to the sulfur atom leaves when the molecule is adsorbed to a surface of the metal, and the sulfur atom is chemically bonded to the metal atom. A structure in which hydrogen is bonded to carbon is likely to be positively charged, but the polarization is not so large as the single molecule. Thus, a large electric dipole moment occurs as a result of the adsorption of the molecule to a surface of the metal.

To allow an organic semiconductor that is likely to work as a p-type semiconductor to operate as an n-type semiconductor, a further larger potential difference (in a reversed direction) should occur between interfaces than that in the case of reducing a Schottky barrier upon p-type operation. An effective material to cause a larger potential difference than that of an alkylthiol is a material corresponding to the alkylthiol, except with a terminal alkali metal. An example of this includes a structure in which a molecule is adsorbed to a surface of gold, which molecule corresponds to butanethiol, except with sodium atom replacing terminal hydrogen, represented by SH—$(CH_2)_4$Na. This structure yields an electric dipole moment of about 3.5 eÅ (angstrom) in a direction from the electrode toward the self-assembled monolayer. This structure can theoretically yield a potential difference up to about 7 V when the areal density is increased to the utmost limit.

However, a structure including a molecule corresponding to an alkylthiol, except with sodium simply replacing terminal hydrogen, is not stable, and the molecule is difficult to be synthetically prepared. Possible candidates herein are molecules that yield smaller potential differences than the molecule just mentioned above but are more easily synthetically prepared. Examples of such candidates include sodium sulfanylbutanoate having terminal COONa and represented by SH—$(CH_2)_3CO_2$Na, and sodium sulfanylbutanolate having terminal ONa and represented by SH—$(CH_2)_4$ONa. These two molecules can yield larger potential differences than that of butanethiol, of which sodium sulfanylbutanoate can yield a larger potential difference than that of sodium sulfanylbutanolate. Self-assembled monolayers composed of these molecules can yield sufficiently large potential differences, because the difference in level between the Fermi level of gold and the lower end of the conduction band of pentacene is about 1.7 eV.

Molecular structures for use herein have been illustrated by taking butanethiol containing four carbon atoms and further having terminal sodium as an example. Similar molecular structures can also be constituted by using another alkylthiol having carbon atom(s) in a different number from that of butanethiol. The atom to be added as terminal atom can be, instead of sodium, another alkali metal such as potassium (K), rubidium (Rb), or cesium (Cs); or another element having a low electronegativity.

An FET structure prepared according to Embodiment 2 has the same structure as in FIG. 2, except for using the molecular material described herein as the material for the self-assembled monolayer 18.

Embodiment 3

Embodiment 3 relates to a technique of constructing a C-TFT while using, as an organic semiconductor, pentacene that is likely to work as a p-type semiconductor. According to this technique, the self-assembled monolayer described in Embodiment 2 is partially arranged in specific portions between electrodes so as to allow pentacene to work as a p-type semiconductor in a specific portion and to work as an n-type semiconductor in another specific portion.

Figure 3:
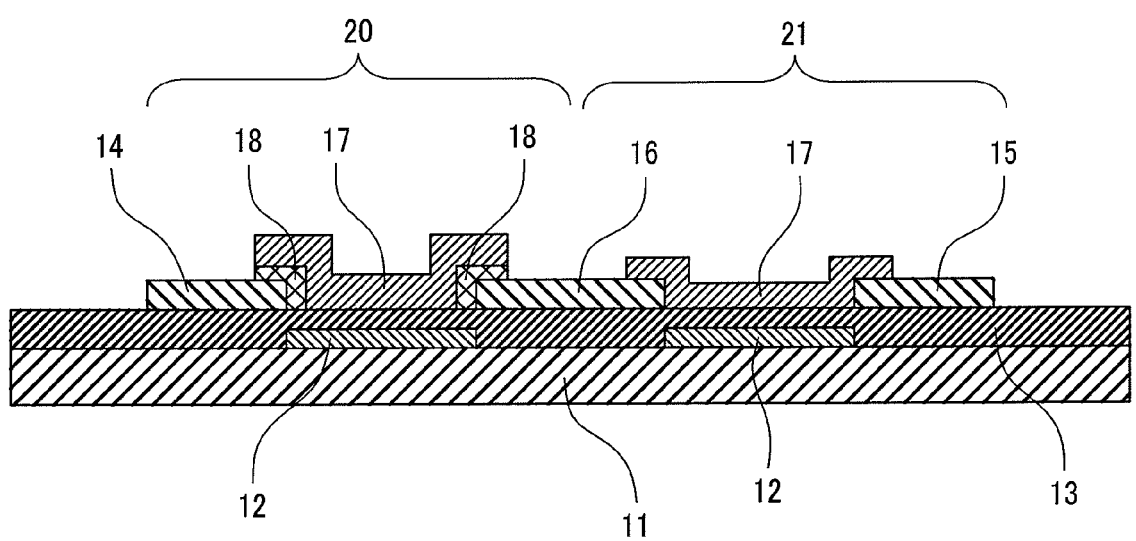
FIG. 3 is a cross sectional view showing a structure of a C-TFT according to an embodiment of the present invention.

FIG. 3 is a cross sectional view schematically illustrating a structure of a C-TFT according to an embodiment (Embodiment 3) of the present invention. An organic thin-film semiconductor 17 in FIG. 3 according to Embodiment 3 is a polycrystalline pentacene thin film composed of pentacene crystal grains. The C-TFT is constituted by a source electrode 14, another source electrode 15, the organic thin-film semiconductor 17, a common drain electrode 16, and two gate electrodes 12. The C-TFT has a structure in which an n-channel FET 20 and a p-channel FET 21 are arranged in series.

In Embodiment 3, the source electrode 15 works as a grounding electrode; the source electrode 14 works as an operating voltage applying electrode so as to input a common voltage signal to the two gate electrodes 12; and the drain electrode 16 works as an output electrode. The difference in structure between the n-channel FET 20 and the p-channel FET 21 is that the self-assembled monolayer 18 is arranged under the organic thin-film semiconductor 17 only on the source electrode 14 and on the left side (the side in the FET 20) of the drain electrode 16. By constituting this structure, two portions of the thin film 17 composed of the same organic semiconductor material can work separately. Specifically, a portion of the organic thin-film semiconductor 17 in the FET 20 works as an n-channel FET, and the other portion in the FET 21 work as a p-channel FET.

The C-TFT may be prepared in the following manner. Initially, two gate electrodes 12 are formed on a substrate 11, and an insulating layer 13 is formed thereon. Next, a source electrode 14, a source electrode 15, and a common drain electrode 16 are formed on the insulating layer 13. In this process, the registration is conducted so that these components have positional relations with the gate electrodes 12 as shown in FIG. 3. Next, a self-assembled monolayer 18 is formed only on the source electrode 14 and on one side of the drain electrode 16 as illustrated in FIG. 3. This self-assembled monolayer used herein is a self-assembled monolayer that can allow pentacene to work as an n-type semiconductor as described in Embodiment 2. Thereafter, an organic thin-film semiconductor 17 is formed between the source electrode 14 and the drain electrode 16 and between the source electrode 15 and the drain electrode 16 to constitute a C-TFT. Finally, the entire surface of C-TFT is covered with a protecting layer so as to prevent the C-TFT from deterioration or denaturation. The self-assembled monolayer 18 and the organic thin-film semiconductor 17 in Embodiment 3 are applied so as to cover part of top surfaces of the source electrode 15 and the drain electrode 16.

Besides this structure, a C-TFT having higher performance can be fabricated by further arranging a self-assembled monolayer between the electrode and the organic semiconductor in the p-channel FET 21 so as to reduce the contact resistance in this region, which self-assembled monolayer is capable of reducing the Schottky barrier between a p-type semiconductor and an electrode, as described in Embodiment 1.

The structure in FIG. 3 does not have a self-assembled monolayer in a p-channel FET in order less to accelerate the performance (to reduce contact resistance) in a p-channel FET and more to reduce the number of processes to thereby manufacture a C-TFT at low cost. As a result, a C-TFT can be manufactured by adding only one process to processes for preparing an organic FET without self-assembled monolayer. The one process herein is a process of applying a solution containing one material for self-assembled monolayer to a necessary position.

Embodiment 4

Embodiment 4 relates to an embodiment of a C-TFT in which pentacene that is likely to work as a p-type semiconductor is used as an organic semiconductor as in Embodiment 3; and an optimal self-assembled monolayer for n-channel FET region and an optimal self-assembled monolayer for p-channel FET region are formed between electrodes and the organic semiconductors, respectively. The structure of this C-TFT is not shown in the figure, because it is the same as that of the C-TFT in FIG. 3, except for further including another self-assembled monolayer 18 arranged between the electrode and the organic semiconductor in the p-channel FET 21.

What is claimed is:

1. A complementary thin film transistor (C-TFT) comprising:
    a substrate;
    two gate electrodes arranged on or above the substrate;
    an insulating layer covering the gate electrodes;
    source/drain electrodes arranged so that the two gate electrodes are each positioned between a source electrode and a drain electrode through the intermediary of the insulating layer and that source/drain electrodes positioned between the two gate electrodes constitute one electrode; and
    an organic thin-film semiconductor arranged between the source/drain electrodes;
    wherein the organic thin-film semiconductor is so configured as to be used as a p-type semiconductor,
    wherein a self-assembled monolayer is arranged in an n-channel field-effect transistor (FET) region between the semiconductor and the source electrode and between the semiconductor and the drain electrode, and
    wherein the self-assembled monolayer is composed of a molecule corresponding to an alkylthiol, except with sodium replacing terminal hydrogen at an opposite end to sulfur, represented by SH—$(CH_2)_n$Na, wherein "n" is an integer of 1 or more.

2. A complementary thin film transistor (C-TFT) comprising:
    a substrate;
    two gate electrodes arranged on or above the substrate;
    an insulating layer covering the gate electrodes;
    source/drain electrodes arranged so that the two gate electrodes are each positioned between a source electrode and a drain electrode through the intermediary of the insulating layer and that source/drain electrodes positioned between the two gate electrodes constitute one electrode;
    an organic thin-film semiconductor arranged between the source/drain electrodes;
    wherein the organic thin-film semiconductor is so configured as to be used as a p-type semiconductor,
    wherein a first self-assembled monolayer is arranged in an n-channel field-effect transistor (FET) region between the semiconductor and the source electrode and between the semiconductor and the drain electrode,
    wherein the first self-assembled monolayer is composed of a molecule corresponding to an alkylthiol, except with sodium replacing terminal hydrogen at an opposite end to sulfur, represented by SH—$(CH_2)_2$Na, wherein "n" is an integer of 1 or more,
    wherein a second self-assembled monolayer is arranged in a p-channel field-effect transistor (FET) region between the thin-film semiconductor and the source electrode and between the thin-film semiconductor and the drain electrode, and
    wherein the second self-assembled monolayer is composed of a perfluoroalkylthiol represented by SH—$(CF_2)_n$F, wherein "n" is an integer of 1 or more.

3. An n-channel field-effect transistor comprising:
    a substrate;
    a gate electrode arranged on or above the substrate;
    an insulating layer covering the gate electrode;
    source/drain electrodes arranged on both sides of the gate electrode through the intermediary of the insulating layer; and
    an organic thin-film semiconductor arranged between the source/drain electrodes,
    wherein a self-assembled monolayer is arranged between the thin-film semiconductor and the source electrode and between the thin-film semiconductor and the drain electrode, and
    wherein the self-assembled monolayer is composed of a molecule corresponding to an alkylthiol, except with sodium replacing terminal hydrogen at an opposite end to sulfur, represented by SH—$(CH_2)_n$Na, wherein "n" is an integer of 1 or more.

* * * * *